United States Patent
Burnett et al.

(10) Patent No.: US 10,102,902 B2
(45) Date of Patent: *Oct. 16, 2018

(54) SUPERCONDUCTING GATE MEMORY CIRCUIT

(71) Applicants: Randall M. Burnett, Catonsville, MD (US); Quentin P. Herr, Ellicott City, MD (US)

(72) Inventors: Randall M. Burnett, Catonsville, MD (US); Quentin P. Herr, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/714,698

(22) Filed: Sep. 25, 2017

(65) Prior Publication Data

US 2018/0114568 A1 Apr. 26, 2018

Related U.S. Application Data

(63) Continuation of application No. 15/351,065, filed on Nov. 14, 2016, now Pat. No. 9,812,192.

(Continued)

(51) Int. Cl.
*G11C 11/44* (2006.01)
*H03K 3/38* (2006.01)
*H03K 19/195* (2006.01)

(52) U.S. Cl.
CPC ............... *G11C 11/44* (2013.01); *H03K 3/38* (2013.01); *H03K 19/195* (2013.01)

(58) Field of Classification Search
CPC ...... G11C 11/44; H01L 39/223; H01L 39/228; H01L 39/2493; H03K 19/1952
(Continued)

(56) References Cited

U.S. PATENT DOCUMENTS

| 5,229,962 A | 7/1993 | Yuh et al. |
| 5,260,264 A | 11/1993 | Kurosawa et al. |

(Continued)

FOREIGN PATENT DOCUMENTS

WO 2016007136 A1 1/2016

OTHER PUBLICATIONS

International Search Report corresponding to International Application No. PCT/US2017/046987, dated Feb. 28, 2018, pp. 1-19.

*Primary Examiner* — Tha-o H Bui
(74) *Attorney, Agent, or Firm* — Tarolli, Sundheim, Covell & Tummino LLP (57) ABSTRACT

One embodiment includes a superconducting gate memory circuit. The circuit includes a Josephson D-gate circuit configured to set a digital state as one of a first data state and a second data state in response to a write enable single flux quantum (SFQ) pulse provided on a write enable input and a respective presence of or absence of a write data SFQ pulse provided on a data write input. The circuit also includes a storage loop coupled to the Josephson D-gate. The storage loop can be configured to store the digital state and to readout the digital state at an output in response to a read enable SFQ pulse provided on a read enable input and a read data SFQ pulse provided on a read data input.

20 Claims, 9 Drawing Sheets

Related U.S. Application Data (60) Provisional application No. 62/383,204, filed on Sep. 2, 2016.

(58) Field of Classification Search
USPC .......................................................... 365/162
See application file for complete search history.

(56) References Cited

U.S. PATENT DOCUMENTS

| | | | |
|---|---|---|---|
| 5,365,476 A | 11/1994 | Mukhanov | |
| 6,483,339 B1* | 11/2002 | Durand | H03K 19/1952 |
| | | | 326/5 |
| 7,724,020 B2 | 5/2010 | Herr | |
| 7,786,748 B1 | 8/2010 | Herr | |
| 7,977,964 B2 | 7/2011 | Herr | |
| 9,455,707 B2 | 9/2016 | Herr et al. | |
| 2011/0267878 A1* | 11/2011 | Herr | G11C 11/44 |
| | | | 365/171 |

\* cited by examiner

SUPERCONDUCTING GATE MEMORY CIRCUIT

RELATED APPLICATION

This application claims priority from U.S. patent application Ser. No. 15/351,065 filed 14 Nov. 2016, which claims priority from U.S. Provisional Patent Application Ser. No. 62/383,204, filed 2 Sep. 2016, both of which are incorporated herein in their entirety.

GOVERNMENT INTEREST

The invention was made under Contract Number W911NF-14-C-01115. Therefore, the U.S. Government has rights to the invention as specified in that contract.

TECHNICAL FIELD

The present disclosure relates generally to quantum and classical digital superconducting circuits, and specifically to a superconducting gate memory circuit.

BACKGROUND

In the field of digital logic, extensive use is made of well known and highly developed CMOS (complimentary metal-oxide semiconductor) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions, with typical signal power of around 4 nW (nanowatts), at a typical data rate of 20 Gb/s (gigabytes/second), or greater, and operating temperatures of around 4° Kelvin.

SUMMARY

One example includes a superconducting gate memory circuit. The circuit includes a Josephson D-gate circuit configured to set a digital state as one of a first data state and a second data state in response to a write enable single flux quantum (SFQ) pulse provided on a write enable input and a respective presence of or absence of a write data SFQ pulse provided on a data write input. The circuit also includes a storage loop coupled to the Josephson D-gate. The storage loop can be configured to store the digital state and to readout the digital state at an output in response to a read enable SFQ pulse provided on a read enable input and a read data SFQ pulse provided on a read data input.

Another example includes a method for reading a digital state from a superconducting gate memory circuit. The method includes storing the digital state as one of a first data state and a second data state via a Josephson D-gate to conduct a loop current associated with a storage loop comprising a readout Josephson junction and an output, the loop current having an amplitude that is based on digital state. The method also includes providing a read enable SFQ pulse on a read enable input to bias the readout Josephson junction. The method further includes providing a read data SFQ pulse on a read data input to trigger or not trigger the readout Josephson junction in response to the read data SFQ pulse to indicate the respective first data state or second data state at the output based on the amplitude of the loop current.

Another example includes a memory cell circuit. The circuit includes a first Josephson transmission line (JTL) interconnect that couples a word-write line to a write enable input to provide a write enable SFQ pulse based on a word-write signal that propagates on the word-write line and a second JTL interconnect that couples a bit-write line to a write data input to provide a write data SFQ pulse based on a bit-write signal that propagates on the bit-write line. The circuit also includes a Josephson D-gate circuit configured to set a digital state as one of a first data state and a second data state in response to the write enable SFQ pulse and a respective presence of or absence of the write data SFQ pulse. The circuit also includes a third JTL interconnect that couples a word-read line to a read enable input to provide a read enable SFQ pulse based on a word-read signal a fourth JTL interconnect that couples a bit-read line to a read data input to provide a read data SFQ pulse based on a bit-read signal. The circuit further includes a storage loop coupled to the Josephson D-gate, the storage loop being configured to store the digital state and to readout the digital state at an output in response to the read enable SFQ pulse and the read data SFQ pulse.

DETAILED DESCRIPTION

The present disclosure relates generally to quantum and classical digital superconducting circuits, and specifically to a superconducting gate memory circuit. Reciprocal quantum logic (RQL) utilizes reciprocal data encoding in which logic operations are completed using positive pulses, while the internal state is erased using corresponding negative pulses that come half a clock cycle later, to produce combinational logic behavior. Examples of RQL logic operations are disclosed in U.S. Pat. No. 7,724,020 and U.S. Pat. No. 7,977,964 both entitled "Single Flux Quantum Circuits", the entire contents of both being incorporated by reference herein.

A superconducting gate memory circuit can include a Josephson D-gate circuit that includes a bi-stable loop configured to set a digital state corresponding to a first data state (e.g., logic 0) or a second data state (e.g., logic 1) and which implements an RQL architecture. As an example, the bi-stable loop can set the digital state based on a bi-stable current corresponding to a superconducting phase of one of a plurality (e.g., pair) of the Josephson junctions that constitute the bi-stable loop. The digital state can be written to the Josephson D-gate circuit based on a write enable SFQ pulse that is provided on an enable input and the presence of or absence of a write data SFQ pulse that is provided on a data input. For example, the absence of the write data SFQ pulse can correspond to a first data state (e.g., logic 0) and the presence of the write data SFQ pulse can correspond to a second data state (e.g., logic 1). In response to the write enable SFQ pulse and/or the write data SFQ pulse, a plurality of the Josephson junctions in the Josephson D-gate circuit can sequentially trigger to set the Josephson junction to a 2π-state to provide the superconducting phase, and thus setting the digital state.

The superconducting gate memory circuit can also include a storage loop that is inductively coupled to the Josephson D-gate via a transformer. The storage loop can be configured to conduct a loop current that is induced via a bias current, with the loop current having an amplitude that corresponds to the digital state. For example, in a first data state of the digital state, the loop current can have a first amplitude based on the induced bias current, and in a second data state, the loop current can have a second amplitude corresponding to the first amplitude minus an induced current component corresponding to the superconducting phase of the Josephson junction associated with the Josephson D-gate. The storage loop can receive a read enable SFQ pulse that is inductively provided to the storage loop to change the amplitude of the loop current to bias a readout Josephson junction that is provided in the storage loop. The storage loop can also receive a read data SFQ pulse that can be configured to trigger the readout Josephson junction in response to the second amplitude of the loop current or not trigger the readout Josephson junction in response to the first amplitude of the loop current. The triggering or not triggering of the readout Josephson junction can thus provide an indication of the digital state at an output of the superconducting gate memory circuit that is coupled to the storage loop.

As an example, the superconducting gate memory circuit can be implemented in a memory cell, such as part of a superconducting memory circuit. The superconducting memory circuit can include the superconducting gate memory circuit, and can further include Josephson transmission line (JTL) interconnects that couple word-lines and bit-lines to the memory cell. As an example, a first JTL interconnect can couple a word-write line associated with all of the memory cells in a row to the write enable input to provide the write enable SFQ pulse based on a word-write signal that propagates on the word-write line, and a second JTL interconnect can couple a bit-write line associated with all of the memory cells in a column to the write data input to provide the write data SFQ pulse based on a bit-write signal that propagates on the bit-write line. Thus, the word-write lines can select a given row of memory cells during a data write operation to write data to the row based on the bit-write lines. Similarly, a third JTL interconnect can couple a word-read line associated with the memory cells in a row to the read enable input to provide the read enable SFQ pulse based on a word-read signal that propagates on the word-read line, and a fourth JTL interconnect can couple a bit-read line associated with all of the memory cells in a column to the read data input to provide the read data SFQ pulse based on a bit-read signal that propagates on the bit-read line. Thus, the word-read lines can select a given row of memory cells during a data read operation to read data from the row based on the bit-read lines. Accordingly, the superconducting gate memory circuits can operate as a memory array to store selectable words of data.

Figure 1:
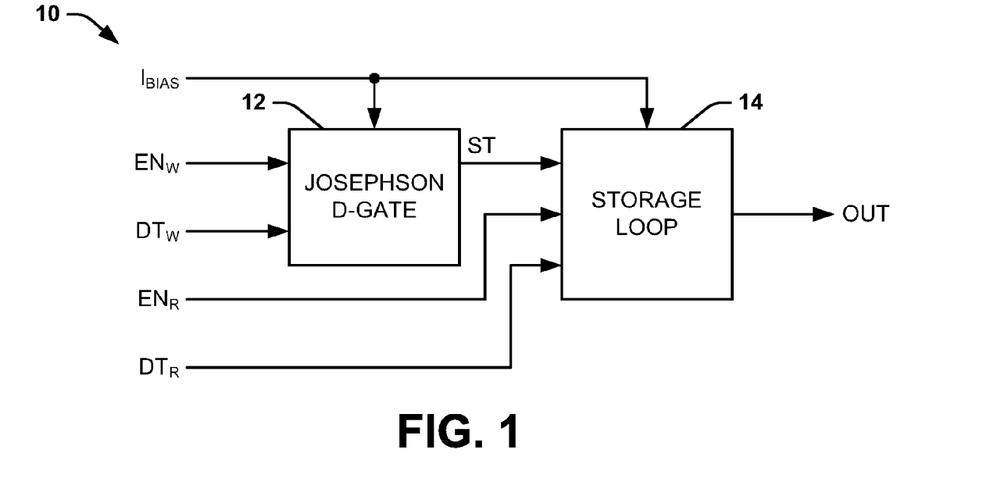
FIG. 1 illustrates an example diagram of a superconducting gate memory circuit.

FIG. 1 illustrates an example diagram of a superconducting gate memory circuit 10. As an example, the superconducting gate memory circuit 10 can be implemented in a memory circuit, such that the superconducting gate memory circuit 10 can correspond to a memory cell in an array.

The superconducting gate memory circuit 10 includes a Josephson D-gate circuit 12. As an example, the Josephson D-gate 12 can include a bi-stable loop that can set a digital state based on a bi-stable current therein. In the example of FIG. 1, a bias current $I_{BIAS}$ is provided to the Josephson D-gate to induce a bias current in the Josephson D-gate to provide a bias on at least one Josephson junction that is arranged therein. As an example, the bias current $I_{BIAS}$ can be provided as a DC current. For example, the bias current $I_{BIAS}$ can be provided in series with each of a plurality of memory cells, with each corresponding to a superconducting gate memory circuit 10, in a given row or column in a given memory array.

During a write operation, the Josephson D-gate circuit 12 receives a write enable signal $EN_W$, such as at a write enable input, and a write data signal $DT_W$, such as at a write data input. As an example, the write enable signal $EN_W$ and the write data signal $DT_W$ can each have a first binary state corresponding to the presence of a single flux quantum (SFQ) pulse and a second binary state corresponding to the absence of an SFQ pulse. For example, the write enable signal $EN_W$ and the write data signal $DT_W$ can be generated by Josephson transmission line (JTL) interconnects based on word-write signals and bit-write signals that are generated in a memory circuit that includes the superconducting gate memory circuit 10. The write enable signal $EN_W$ can thus enable a write operation to the superconducting gate memory circuit 10 for the storage of the digital state, and the write data signal $DT_W$ can correspond to the digital state based on the presence of or absence of the write data SFQ pulse. For example, the absence of the write data SFQ pulse can correspond to a first data state (e.g., logic 0) and the presence of the write data SFQ pulse can correspond to a second data state (e.g., logic 1). In response to the write enable SFQ pulse and/or the write data SFQ pulse, a plurality of the Josephson junctions in the Josephson D-gate circuit 12 can sequentially trigger to set one of the Josephson junctions to a 2π-state to generate a superconducting phase (e.g., bi-stable current) corresponding to setting the digital state. The manner of setting the digital state is described in Ser. No. 14/325,518 (now U.S. Pat. No. 9,455,707, issued 27 Sep. 2016), which is incorporated herein in its entirety by reference.

In the example of FIG. 1, the digital state is represented by a signal ST that is provided to a storage loop 14. The digital state ST thus corresponds to either the first data state or the second data state that is then stored in the storage loop 14. As an example, the storage loop 14 can be configured as a superconducting loop that is configured to conduct a loop current having an amplitude that is based on the digital state. In addition, for example, the storage loop 14 can include a readout Josephson junction that can provide an indication of the digital state as an output signal OUT during a read operation, such as based on an amplitude of the loop current as corresponding to the digital state.

During a read operation, the storage loop 14 receives a read enable signal $EN_R$, such as at a read enable input, and a read data signal $DT_R$, such as at a read data input. As an example, the read enable signal $EN_R$ and the read data signal $DT_R$ can each be provided as SFQ pulses. For example, the read enable signal $EN_R$ and the read data signal $DT_R$ can be generated by JTL interconnects based on word-read signals and bit-read signals that are generated in a memory circuit that includes the superconducting gate memory circuit 10. The read enable signal $EN_R$ can thus enable a read operation to the superconducting gate memory circuit 10, and the read data signal $DT_R$ can trigger a readout of digital state as the output signal OUT based on the presence of or absence of the read data SFQ pulse.

In the example of FIG. 1, the storage loop 14 is likewise configured to receive the bias current $I_{BIAS}$ that can be provided to at least one loop transformer to induce the loop current in the storage loop 14. The Josephson D-gate 12 can thus set the digital state ST, which can induce a current component in the loop current of the storage loop 14 based on the superconducting phase of the Josephson junction of the Josephson D-gate. Thus, the digital state ST can affect the amplitude of the loop current in the storage loop 14. As an example, the read enable signal $EN_R$ can thus be provided to likewise affect the amplitude of the loop current of the storage loop 14 via an inductive coupling, and thus can provide a bias for the readout Josephson junction. Therefore, in the first data state, the read data signal $DT_R$ may be insufficient to trigger the readout Josephson junction, which can thus provide an indication of the digital state being in the first data state as the output signal OUT. However, in the second data state, the readout Josephson junction may be sufficiently biased, such that the read data signal $DT_R$ triggers the readout Josephson junction, which can thus provide an indication of the digital state being in the second data state as the output signal OUT. Accordingly, the superconducting gate memory circuit 10 can be configured to store the digital state in a data write operation, which can thus be read from the storage loop in a data read operation.

Figure 2:
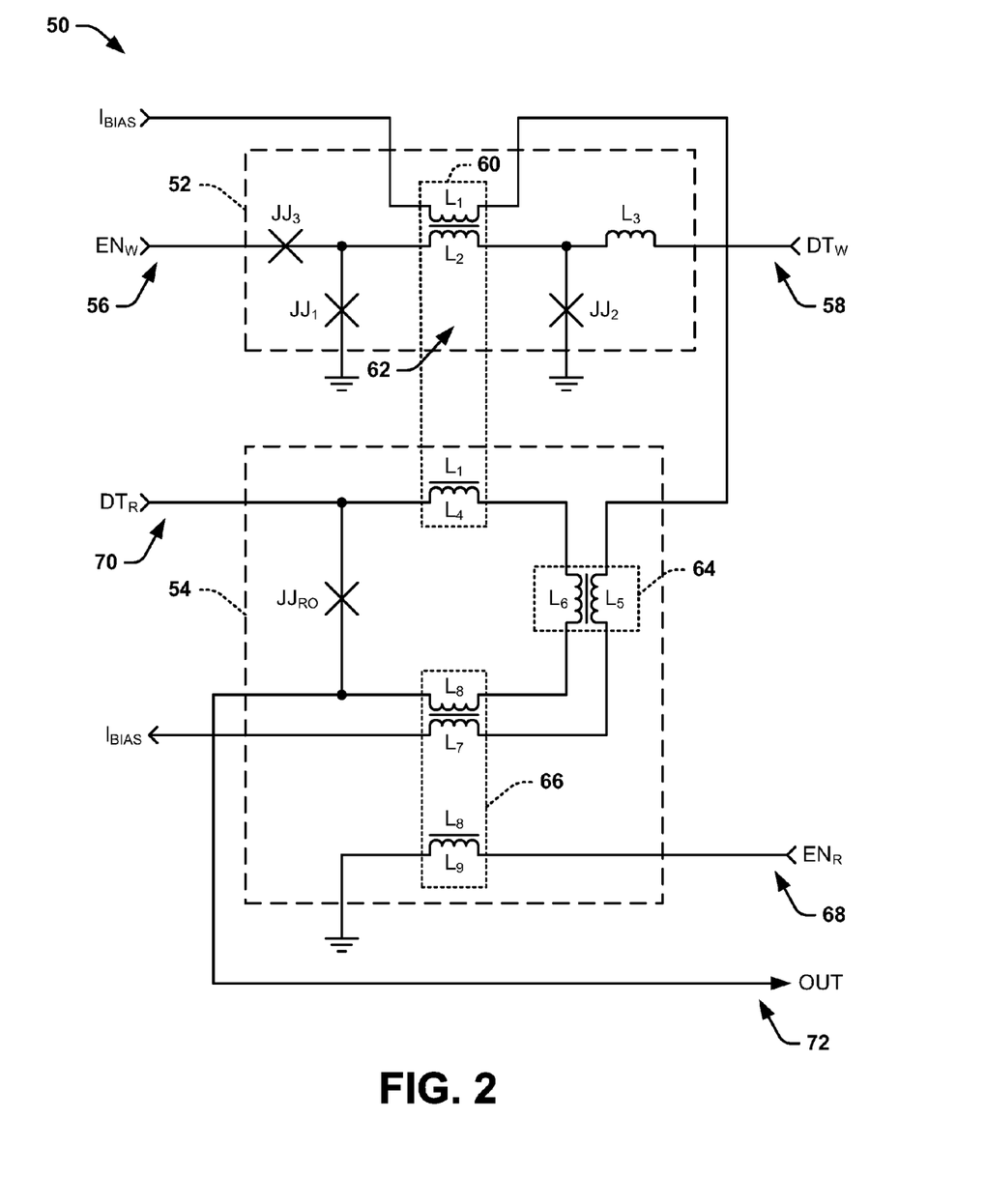
FIG. 2 illustrates an example of a superconducting gate memory circuit.

FIG. 2 illustrates an example of a superconducting gate memory circuit 50. As an example, the superconducting gate memory circuit 50 can be implemented in a memory circuit, such that the superconducting gate memory circuit 50 can correspond to a memory cell in an array.

The superconducting gate memory circuit 50 includes a Josephson D-gate circuit 52 and a storage loop 54. The Josephson D-gate circuit 52 includes a write enable input 56 on which the write enable signal $EN_W$ is provided and a write data input 58 on which the write data signal $DT_W$ is provided. The Josephson D-gate circuit 52 also includes a bias transformer 60 that includes a primary inductor $L_1$ and a secondary inductor $L_2$. A bias current $I_{BIAS}$ is provided through the primary inductor $L_1$ to induce a bias current in the secondary inductor $L_2$. The Josephson D-gate circuit 52 also includes a bi-stable loop 62 that is formed by a first Josephson junction $JJ_1$, a second Josephson junction $JJ_2$, and the secondary inductor $L_2$. The Josephson D-gate circuit 52 also includes a third Josephson junction $JJ_3$ interconnecting the write enable input 56 and the bi-stable loop 62, and an inductor $L_3$ interconnecting the write data input 58 and the bi-stable loop 62.

The storage loop 54 includes a first loop transformer 64 that includes a primary inductor $L_5$ and a secondary inductor $L_6$, and a second loop transformer 66 that includes a primary inductor $L_7$ and a secondary inductor $L_8$. The bias current $I_{BIAS}$ is provided through the primary inductors $L_5$ and $L_7$ to induce a loop current in the respective secondary inductors $L_6$ and $L_8$. In addition, in the example of FIG. 2, the bias transformer 60 also includes a tertiary inductor $L_4$ that is likewise inductively coupled to the primary inductor $L_1$ and the secondary inductor $L_2$. Therefore, the loop current likewise flows through the tertiary inductor $L_4$ in response to the bias current $I_{BIAS}$ flowing through the primary inductor $L_1$ in the Josephson D-gate circuit 52. The storage loop 54 also includes a readout Josephson junction $JJ_{RO}$ that is arranged in series with the tertiary inductor $L_4$ and the secondary inductors $L_6$ and $L_8$. Therefore, the storage loop 54 is arranged as a superconducting loop around which the loop current flows.

The storage loop 54 also includes a read enable input 68 on which the read enable signal $EN_R$ is provided. The read enable signal $EN_R$ is demonstrated as being provided through a tertiary inductor $L_9$ that is likewise inductively coupled to the primary inductor $L_7$ and the secondary inductor $L_8$. As an example, the tertiary inductor $L_9$ can be wound with respect to the primary and secondary inductors $L_7$ and $L_8$ such that the read enable signal $EN_R$ can induce current in an opposite direction relative to the bias current $I_{BIAS}$, as described in greater detail herein. In addition, the storage loop 54 also includes a read data input 70 on which the read data signal $DT_R$ is provided, and an output 72 on which the output signal OUT is provided. The readout Josephson junction $JJ_{RO}$ interconnects the read data input 70 and the output 72, such that the output signal OUT can be provided as one of an SFQ pulse or no SFQ pulse at the output 72 in response to no triggering or triggering of the readout Josephson junction $JJ_{RO}$, as described in greater detail herein, based on the amplitude of the loop current.

As described herein, the term "amplitude of the loop current" with respect to the loop current $I_{LOOP}$ describes an amplitude of the loop current $I_{LOOP}$ in a given one direction of current flow, as opposed to an absolute value of the amplitude of the loop current $I_{LOOP}$, and thus irrespective of current direction. Therefore, the loop current $I_{LOOP}$ can have a first amplitude corresponding to a positive amplitude (e.g., clockwise), such as corresponding to the digital state having the first data state (e.g., logic-zero), as described in greater detail herein. The loop current $I_{LOOP}$ can also have an amplitude that is less than the first amplitude, but is still positive (e.g., still clockwise), such as based on the current component 154 being induced via the read enable SFQ pulse $EN_R$ while the storage loop 54 stores the first data state, as described in greater detail herein. The loop current $I_{LOOP}$ can also have an amplitude that is approximately zero (e.g., slightly positive or slightly negative), such as corresponding to the digital state having the second data state (e.g., logic-one), as described in greater detail herein. Additionally, the loop current $I_{LOOP}$ can have an amplitude that is negative (e.g., counter-clockwise), such as based on the current component 154 being induced via the read enable SFQ pulse $EN_R$ while the storage loop 54 stores the second data state, as described in greater detail herein. The possible amplitudes described herein are provided by example, such that the loop current $I_{LOOP}$ can have a broad variety of amplitudes that can correspond to a respective variety of conditions associated with the digital state and/or the data write and data read operations, with none or some of the amplitudes corresponding to different current directions in the storage loop 54. Therefore, in a quiescent state in each of the first and second data states of the stored digital state, the loop current $I_{LOOP}$ has a different amplitude, which may or may not correspond to different current directions.

Figure 3:
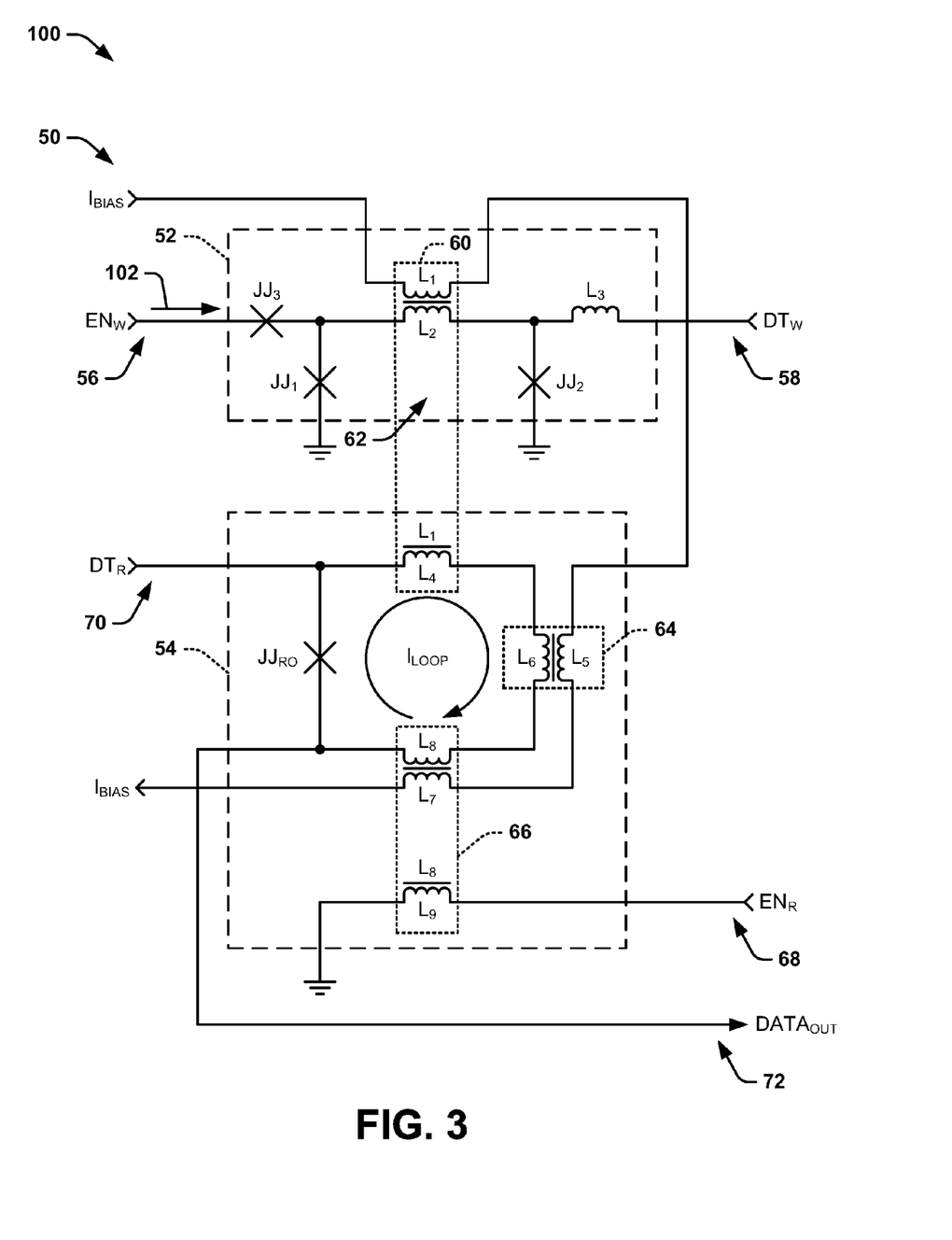
FIG. 3 illustrates an example diagram of a data write operation of a superconducting gate memory circuit.

FIG. 3 illustrates an example diagram 100 of a data write operation to the superconducting gate memory circuit 50. The diagram 100 can thus correspond to the superconducting gate memory circuit 50 in the example of FIG. 2 that is storing the digital state corresponding to a first data state (e.g., logic-zero). As described herein, like reference numbers and reference is to be made to the superconducting gate memory circuit 50 in the example of FIG. 2 in the following description of the superconducting gate memory circuit 100 in the example of FIG. 3.

In the example of FIG. 3, the bias current $I_{BIAS}$ is provided as a DC current through each of the primary inductors $L_1$, $L_5$, and $L_7$ in each of the transformers 60, 64, and 66. The bias current $I_{BIAS}$ can thus be induced as the loop current, demonstrated in the example of FIG. 3 as a loop current $I_{LOOP}$, via the tertiary inductor $L_4$, the secondary inductor $L_6$, and the secondary inductor $L_8$ of the transformers 60, 64, and 66, respectively. As an example, the windings of the transformers 60, 64, and 66 can be such that induced loop current $I_{LOOP}$ can have the same current direction in response to the bias current $I_{BIAS}$, such that the tertiary inductor $L_4$, the secondary inductor $L_6$, and the secondary inductor $L_8$ of the transformers 60, 64, and 66 can induce the loop current $I_{LOOP}$ in an additive manner in response to the bias current $I_{BIAS}$. Therefore, in the example of FIG. 3, the loop current $I_{LOOP}$ is demonstrated as flowing in a given direction (e.g., clockwise) around the storage loop 54.

As an example, the given direction (e.g., clockwise) of the loop current $I_{LOOP}$ can correspond to a given data state (e.g., logic-zero) of the digital state stored in the storage loop 54. For example, the Josephson D-gate circuit 52 can be configured to set the digital state to the first data state during the data write operation, such that a logic-zero is written to the storage loop 54, as described herein. In the example of FIG. 3, a write enable SFQ pulse $EN_W$ is provided on the write enable input 56 to select the superconducting gate memory circuit 50 for the data write operation, as demonstrated with an arrow 102. Approximately concurrently, no write data SFQ pulse $DT_W$ is provided on the write data input 58, as indicated by a lack of an arrow at the write data input 58. Therefore, in the write data operation demonstrated by the diagram 100, the superconducting gate memory circuit 50 stores the digital state as the first data state in which the loop current $I_{LOOP}$ is provided as having an amplitude that provides flow of the loop current $I_{LOOP}$ in a clockwise manner around the storage loop 54. Therefore, the loop current $I_{LOOP}$ has an amplitude that is based only on the loop current $I_{LOOP}$ being induced via the tertiary inductor $L_4$, the secondary inductor $L_6$, and the secondary inductor $L_8$ of the transformers 60, 64, and 66 based on the bias current $I_{BIAS}$.

Figure 4:
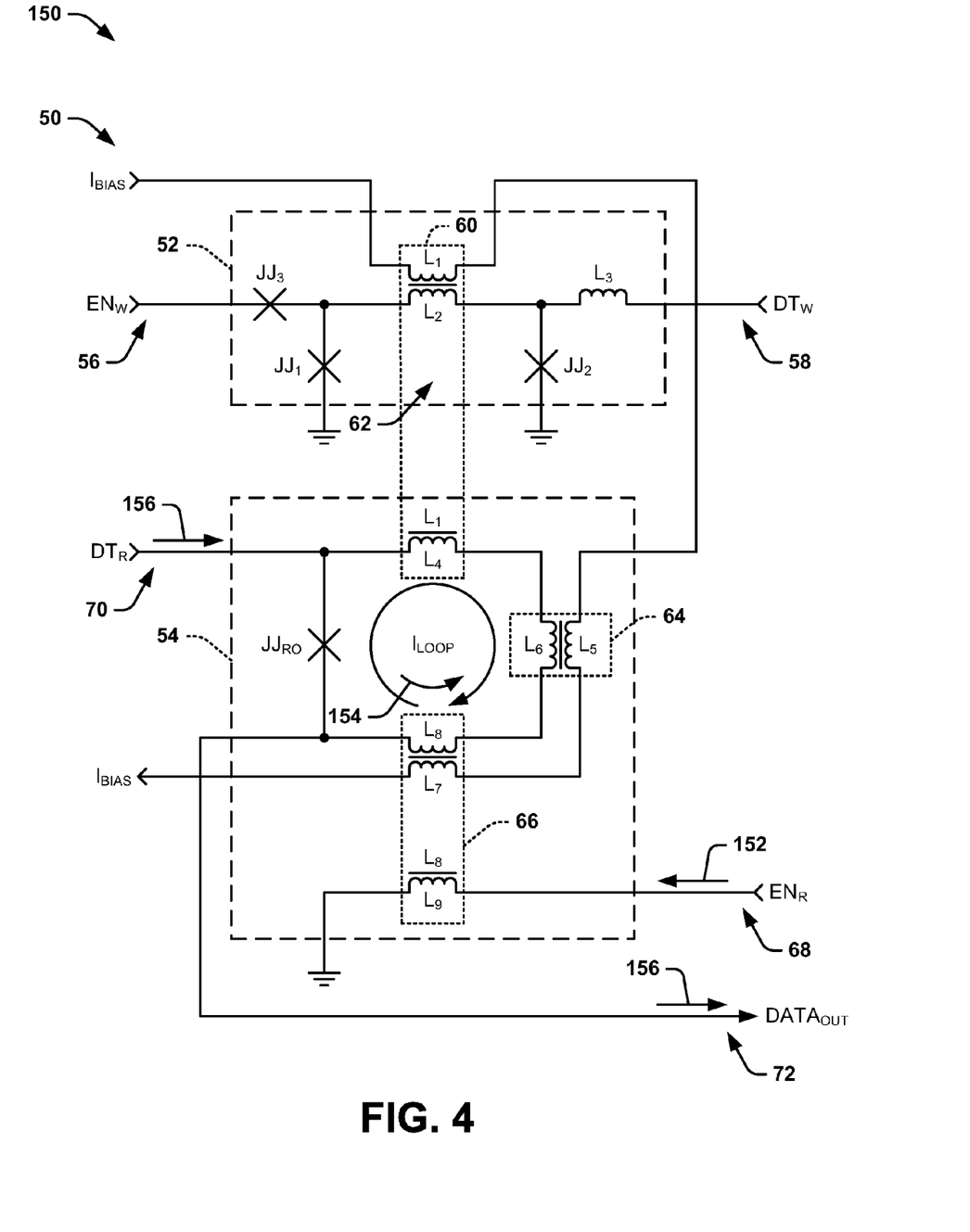
FIG. 4 illustrates an example diagram of a data read operation of the superconducting gate memory circuit.

FIG. 4 illustrates an example diagram 150 of a data read operation of the superconducting gate memory circuit 50. The diagram 150 can thus correspond to the superconducting gate memory circuit 50 in the example of FIG. 2 that is storing the digital state corresponding to the first data state (e.g., logic-zero), as provided via the data write operation described in the example of FIG. 3. As described herein, like reference numbers and reference is to be made to the superconducting gate memory circuit 50 in the example of FIGS. 2 and 3 in the following description of the diagram 150 in the example of FIG. 4.

In the example of FIG. 4, the bias current $I_{BIAS}$ is still provided as a DC current through each of the primary inductors $L_1$, $L_5$, and $L_7$ in each of the transformers 60, 64, and 66. The bias current $I_{BIAS}$ is thus still induced as the loop current $I_{LOOP}$ via the tertiary inductor $L_4$, the secondary inductor $L_6$, and the secondary inductor $L_8$ of the transformers 60, 64, and 66, respectively. During the data read operation, a read enable SFQ pulse $EN_R$ is received at the read enable input 68, as demonstrated by an arrow 152. The read enable SFQ pulse $EN_R$ is provided through the tertiary inductor $L_9$ that is likewise inductively coupled to the primary inductor $L_7$ and the secondary inductor $L_8$ of the loop transformer 66. Because, the tertiary inductor $L_9$ is wound to induce current opposite with respect to the primary and secondary inductors $L_7$ and $L_8$, the read enable SFQ pulse $EN_R$ induces a current component, demonstrated in the example of FIG. 4 as a counter-clockwise arrow 154, in an opposite direction relative to the bias current $I_{BIAS}$ to bias the readout Josephson junction $JJ_{RO}$. Therefore, in the example of FIG. 4, the current component 154 changes the amplitude of the loop current $I_{LOOP}$ by subtracting the amplitude of the current component 154 from the amplitude of the loop current $I_{LOOP}$ resulting from the induced bias current $I_{BIAS}$.

Also during the data read operation (e.g., approximately concurrently with application of the read enable SFQ pulse $EN_R$), the read data SFQ pulse $DT_R$ is received at the read data input 70, as demonstrated by an arrow 156. The read data SFQ pulse $DT_R$ is provided to the readout Josephson junction $JJ_{RO}$ in the storage loop 54, and is thus subtracted from the loop current $I_{LOOP}$. In the example of FIG. 4, based on the instantaneous amplitude of the loop current $I_{LOOP}$, the amplitude of the read data SFQ pulse $DT_R$ subtracted from the amplitude of the loop current $I_{LOOP}$ is insufficient to trigger the readout Josephson junction $JJ_{RO}$. As a result, the read data SFQ pulse $DT_R$ passes through the readout Josephson junction $JJ_{RO}$ to the output 72, and is thus provided as the output signal OUT, demonstrated in the example of FIG. 4 as an arrow 158. Therefore, during the data read operation in the example of FIG. 4, the output signal OUT is provided as an SFQ pulse, which is thus indicative of the digital state of the superconducting gate memory circuit 50 corresponding to the first data state (e.g., logic-zero) based on a failure of the readout Josephson junction $JJ_{RO}$ to trigger. Accordingly, the output signal OUT provides an indication of the first data state based on the output signal OUT being provided as an SFQ pulse.

Figure 5:
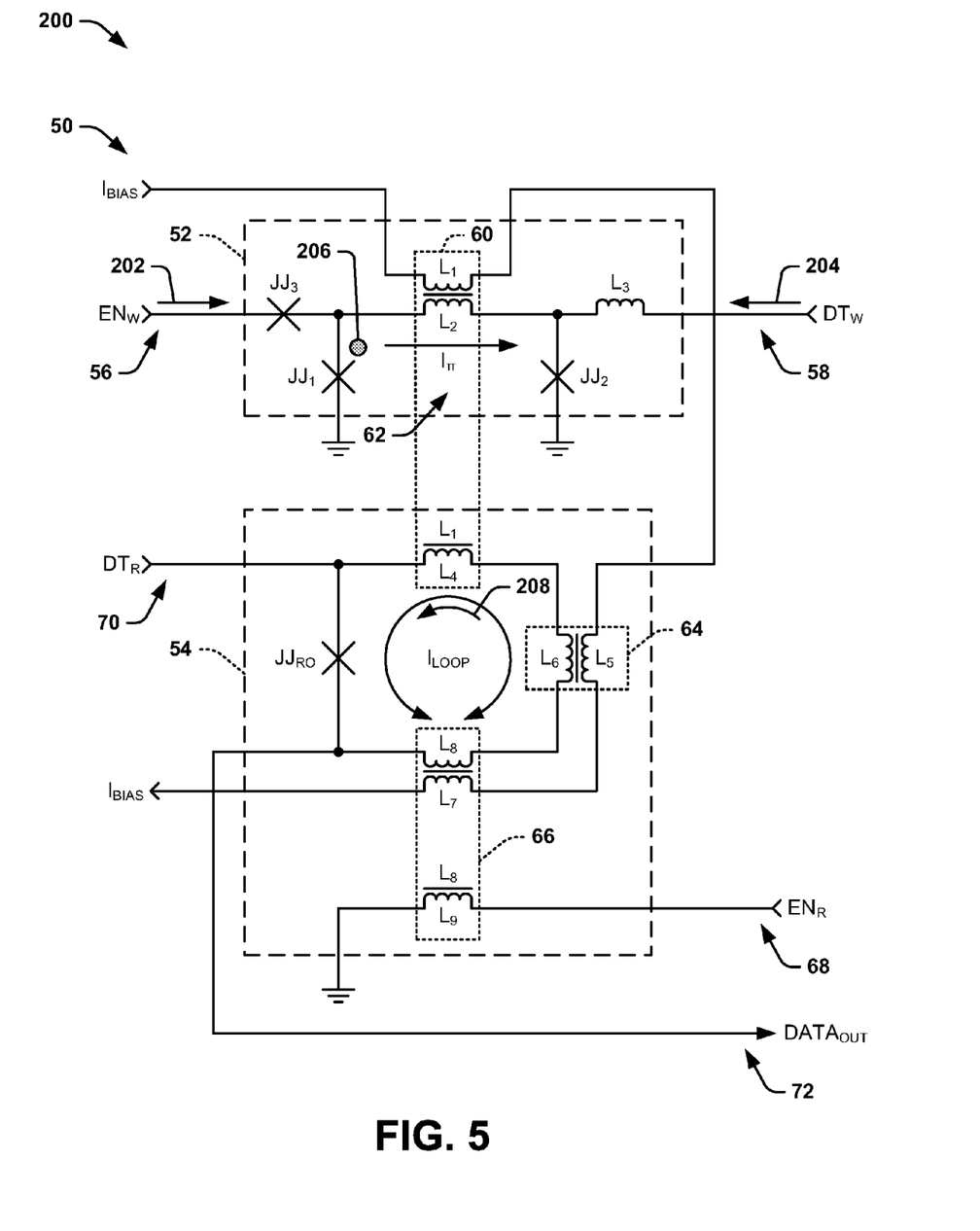
FIG. 5 illustrates another example diagram of a data write operation of a superconducting gate memory circuit.

FIG. 5 illustrates an example diagram 200 of a data write operation to the superconducting gate memory circuit 50. The diagram 200 can thus correspond to the superconducting gate memory circuit 50 in the example of FIG. 2 that is storing the digital state corresponding to a first data state (e.g., logic-zero). As described herein, like reference numbers and reference is to be made to the superconducting gate memory circuit 50 in the example of FIG. 2 in the following description of the diagram 200 in the example of FIG. 5.

In the example of FIG. 5, the bias current $I_{BIAS}$ is provided as a DC current through each of the primary inductors $L_1$, $L_5$, and $L_7$ in each of the transformers 60, 64, and 66. The bias current $I_{BIAS}$ can thus be induced as the loop current, demonstrated in the example of FIG. 5 as a loop current $I_{LOOP}$, via the tertiary inductor $L_4$, the secondary inductor $L_6$, and the secondary inductor $L_8$ of the transformers 60, 64, and 66, respectively. As an example, the windings of the transformers 60, 64, and 66 can be such that induced loop current $I_{LOOP}$ can have the same current direction in response to the bias current $I_{BIAS}$, such that the tertiary inductor $L_4$, the secondary inductor $L_6$, and the secondary inductor $L_8$ of the transformers 60, 64, and 66 can induce the loop current $I_{LOOP}$ in an additive manner in response to the bias current $I_{BIAS}$.

In the example of FIG. 5, the Josephson D-gate circuit 52 can be configured to set the digital state to the second data state during the data write operation, such that a logic-one is written to the storage loop 54, as described herein. In the example of FIG. 5, a write enable SFQ pulse $EN_W$ is provided on the write enable input 56 to select the superconducting gate memory circuit 50 for the data write operation, as demonstrated with an arrow 202. Approximately concurrently, a write data SFQ pulse $DT_W$ is provided on the write data input 58, as indicated by an arrow 204. In response to the combination of the write enable SFQ pulse $EN_W$ and the write data SFQ pulse $DT_W$, the Josephson junction $JJ_1$ can be set to a $2\pi$-state, as indicated at 206, to generate a superconducting phase (e.g., bi-stable current) in the example of FIG. 5, the superconducting phase is demonstrated as a spontaneous supercurrent $I_\pi$ that flows from the Josephson junction $JJ_1$ to the Josephson junction $JJ_2$. As a result, the superconducting phase $I_\pi$ is induced as a current component, demonstrated by an arrow 208, via the tertiary inductor $L_4$ based on the inductive coupling to the secondary inductor $L_2$. As a result, the amplitude of the current component 208 is subtracted from the amplitude of the loop current $I_{LOOP}$ resulting from the induced bias current $I_{BIAS}$. Therefore, in the second data state, the loop current $I_{LOOP}$ has an amplitude that is less than the amplitude of the loop current $I_{LOOP}$ in the first data state. For example, the loop current $I_{LOOP}$ can have an amplitude that is approximately zero (e.g., slightly positive or slightly negative) in the second data state.

Figure 6:
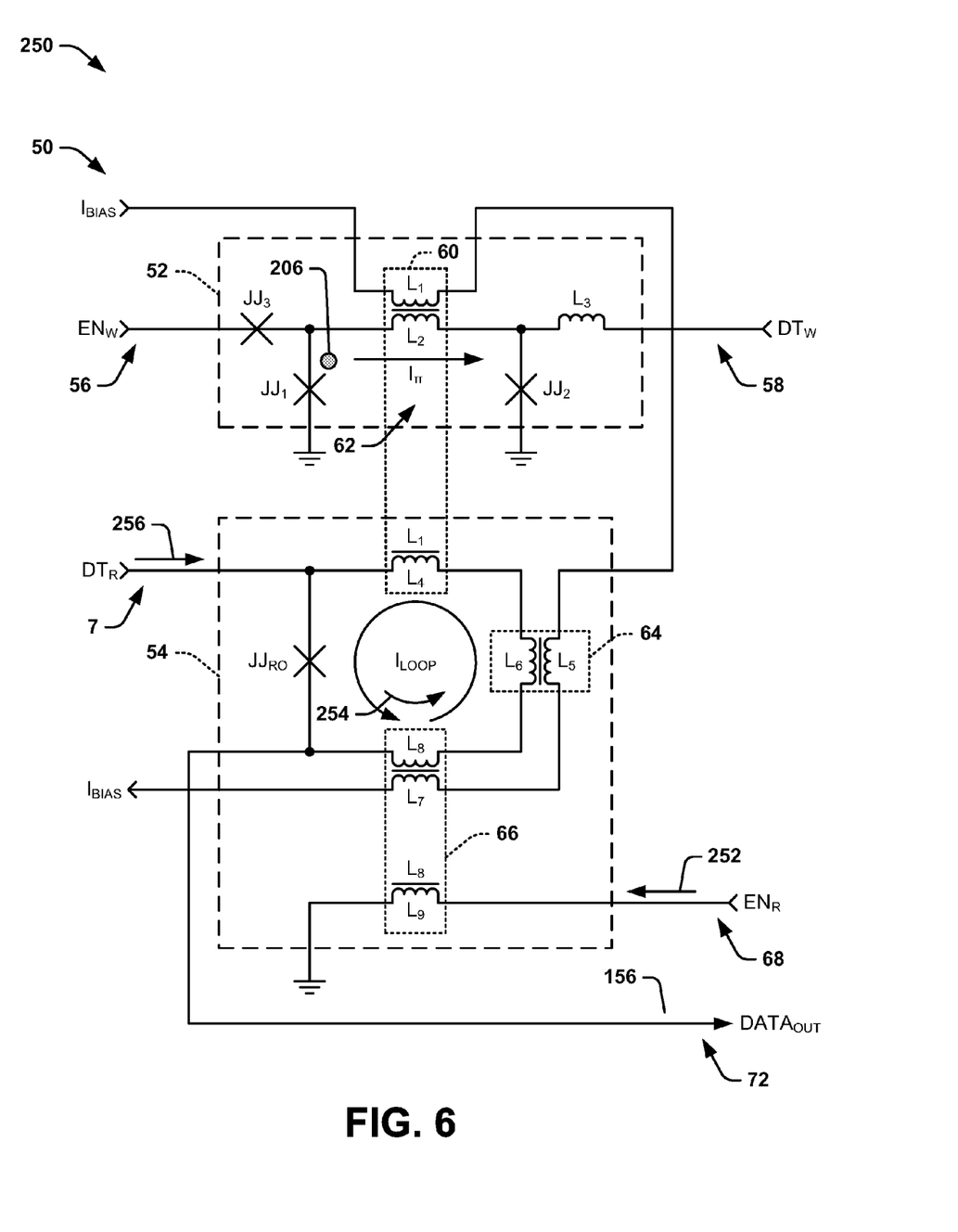
FIG. 6 illustrates another example diagram of a data read operation of the superconducting gate memory circuit.

FIG. 6 illustrates an example diagram 250 of a data read operation of the superconducting gate memory circuit 50. The diagram 250 can thus correspond to the superconducting gate memory circuit 50 in the example of FIG. 2 that is storing the digital state corresponding to the first data state (e.g., logic-zero), as provided via the data write operation described in the example of FIG. 5. As described herein, like reference numbers and reference is to be made to the superconducting gate memory circuit 50 in the example of FIGS. 2 and 5 in the following description of the diagram 250 in the example of FIG. 6.

In the example of FIG. 6, the bias current $I_{BIAS}$ is still provided as a DC current through each of the primary inductors $L_1$, $L_5$, and $L_7$ in each of the transformers 60, 64, and 66. The bias current $I_{BIAS}$ is thus still induced as the loop current $I_{LOOP}$ via the tertiary inductor $L_4$, the secondary inductor $L_6$, and the secondary inductor $L_8$ of the transformers 60, 64, and 66, respectively. Additionally, the superconducting phase $I_\pi$ flows from the Josephson junction $JJ_1$ to the Josephson junction $JJ_2$, thus inducing the current component 208 in the storage loop 54. Therefore, the loop current $I_{LOOP}$ has a reduced amplitude (e.g., approximately zero amplitude) in the second data state relative to the amplitude of the loop current $I_{LOOP}$ in the first data state, as described previously in the example of FIG. 5.

During the data read operation, a read enable SFQ pulse $EN_R$ is received at the read enable input 68, as demonstrated by an arrow 252. The read enable SFQ pulse $EN_R$ is provided through the tertiary inductor $L_9$ that is likewise inductively coupled to the primary inductor $L_7$ and the secondary inductor $L_8$ of the loop transformer 66. Because, the tertiary inductor $L_9$ is wound to induce current opposite with respect to the primary and secondary inductors $L_7$ and $L_8$, the read enable SFQ pulse $EN_R$ induces a current component, demonstrated in the example of FIG. 6 as a counter-clockwise arrow 254, in an opposite direction relative to the bias current $I_{BIAS}$ to bias the readout Josephson junction $JJ_{RO}$. Therefore, in the example of FIG. 6, the current component 254 changes the amplitude of the loop current $I_{LOOP}$ by subtracting the amplitude of the current component 254 from the amplitude of the loop current $I_{LOOP}$ resulting from the induced bias current $I_{BIAS}$. Therefore, the combination of the current components 208 and 254 can provide an even lesser amplitude of the loop current $I_{LOOP}$ (e.g., negative amplitude).

Also during the data read operation (e.g., approximately concurrently with application of the read enable SFQ pulse $EN_R$), the read data SFQ pulse $DT_R$ is received at the read data input 70, as demonstrated by an arrow 256. The read data SFQ pulse $DT_R$ is provided to the readout Josephson junction $JJ_{RO}$ in the storage loop 54, and is thus subtracted from the loop current $I_{LOOP}$. In the example of FIG. 6, based on the instantaneous amplitude of the loop current $I_{LOOP}$, the amplitude of the read data SFQ pulse $DT_R$ subtracted from the amplitude of the loop current $I_{LOOP}$ is sufficient to achieve the threshold voltage of the readout Josephson junction $JJ_{RO}$, and thus to trigger the readout Josephson junction $JJ_{RO}$. As a result, the readout Josephson junction $JJ_{RO}$ generates a voltage pulse in the opposite direction relative to the read data SFQ pulse $DT_R$, and thus blocks the read data SFQ pulse $DT_R$. As a result, the read data SFQ pulse $DT_R$ is prevented from passing through the readout Josephson junction $JJ_{RO}$ to the output 72. Therefore, during the data read operation in the example of FIG. 6, the output signal OUT is provided as no SFQ pulse, which is thus indicative of the digital state of the superconducting gate memory circuit 50 corresponding to the second data state (e.g., logic-one) based on the triggering of the readout Josephson junction $JJ_{RO}$. Accordingly, the output signal OUT provides an indication of the second data state based on the output signal OUT being provided as no SFQ pulse.

Figure 7:
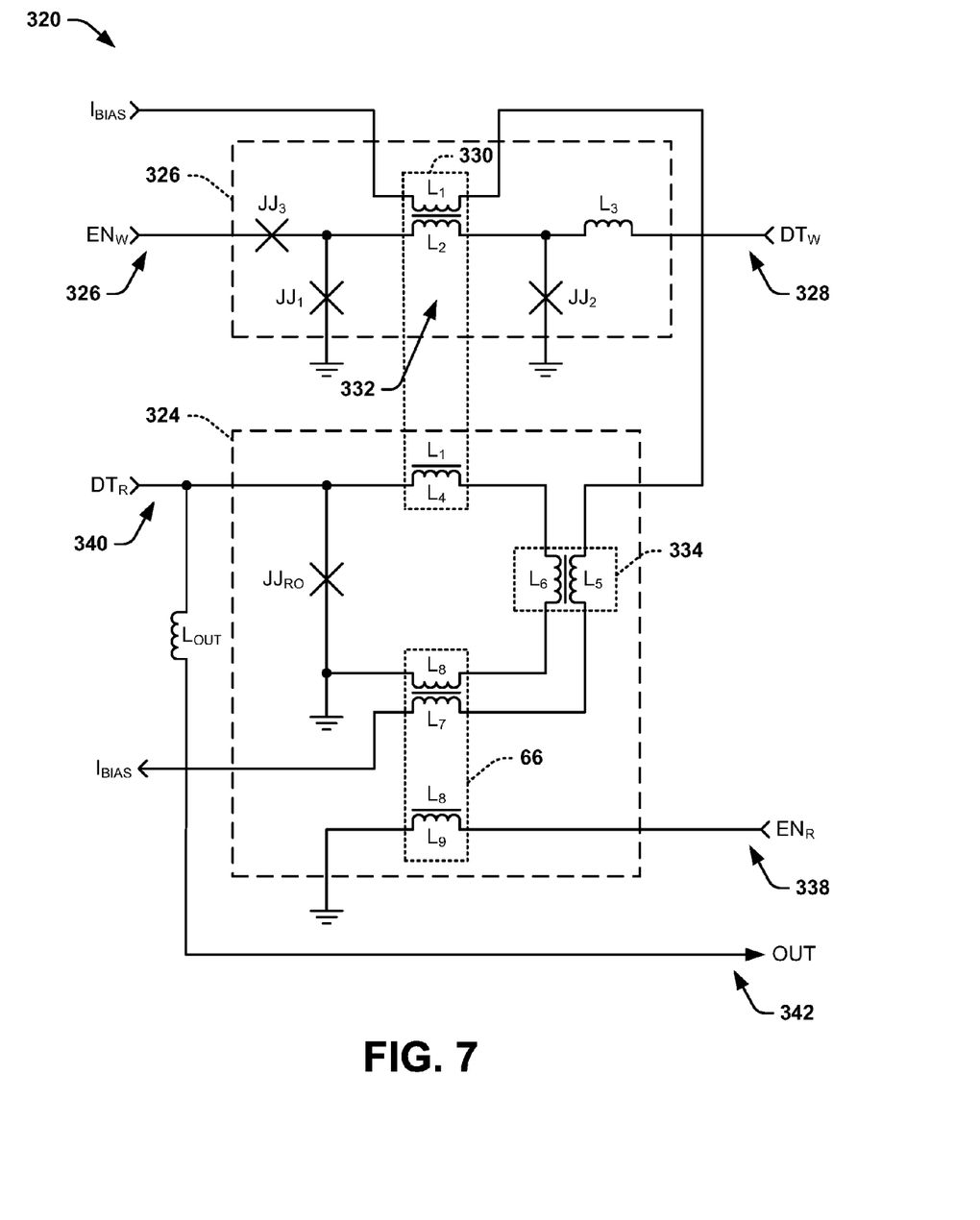
FIG. 7 illustrates another example of a superconducting gate memory circuit.

FIG. 7 illustrates another example of a superconducting gate memory circuit 320. As an example, the superconducting gate memory circuit 320 can be implemented in a memory circuit, such that the superconducting gate memory circuit 320 can correspond to a memory cell in an array.

The superconducting gate memory circuit 320 includes a Josephson D-gate circuit 322 and a storage loop 324. The Josephson D-gate circuit 322 includes a write enable input 326 on which the write enable signal $EN_W$ is provided and a write data input 328 on which the write data signal $DT_W$ is provided. The Josephson D-gate circuit 322 also includes a bias transformer 330 that includes a primary inductor $L_1$ and a secondary inductor $L_2$. A bias current $I_{BIAS}$ is provided through the primary inductor $L_1$ to induce a bias current in the secondary inductor $L_2$. The Josephson D-gate circuit 322 also includes a bi-stable loop 332 that is formed by a first Josephson junction $JJ_1$, a second Josephson junction $JJ_2$, and the secondary inductor $L_2$. The Josephson D-gate circuit 322 also includes a third Josephson junction $JJ_3$ interconnecting the write enable input 326 and the bi-stable loop 332, and an inductor $L_3$ interconnecting the write data input 328 and the bi-stable loop 332.

The storage loop 324 includes a first loop transformer 334 that includes a primary inductor $L_5$ and a secondary inductor $L_6$, and a second loop transformer 336 that includes a primary inductor $L_7$ and a secondary inductor $L_8$. The bias current $I_{BIAS}$ is provided through the primary inductors $L_5$ and $L_7$ to induce a loop current in the respective secondary inductors $L_6$ and $L_8$. In addition, in the example of FIG. 7, the bias transformer 330 also includes a tertiary inductor $L_4$ that is likewise inductively coupled to the primary inductor $L_1$ and the secondary inductor $L_2$. Therefore, the loop current likewise flows through the tertiary inductor $L_4$ in response to the bias current $I_{BIAS}$ flowing through the primary inductor $L_1$ in the Josephson D-gate circuit 322. The storage loop 324 also includes a readout Josephson junction $JJ_{RO}$ that is arranged in series with the tertiary inductor $L_4$ and the secondary inductors $L_6$ and $L_8$. Therefore, the storage loop 324 is arranged as a superconducting loop around which the loop current flows.

The storage loop 324 also includes a read enable input 338 on which the read enable signal $E_{NR}$ is provided. The read enable signal $E_{NR}$ is demonstrated as being provided through a tertiary inductor $L_9$ that is likewise inductively coupled to the primary inductor $L_7$ and the secondary inductor $L_8$. As an example, the tertiary inductor $L_9$ can be wound with respect to the primary and secondary inductors $L_7$ and $L_8$ such that the read enable signal $E_{NR}$ can induce current in an opposite direction relative to the bias current $I_{BIAS}$, as described in greater detail herein. In addition, the storage loop 324 also includes a read data input 340 on which the read data signal $DT_R$ is provided, and an output 342 on which the output signal OUT is provided.

As opposed to the storage loop 54 in the example of FIG. 2, in the example of FIG. 7, the read data input 340 is coupled to both the readout Josephson junction $JJ_{RO}$ and the output via an output inductor $_{LOUT}$. Also as opposed to the storage loop 54 in the example of FIG. 2, the storage loop 324 is grounded, such that the readout Josephson junction $JJ_{RO}$ interconnects the read data input 340 and ground. The storage loop 324 behaves substantially similar to the storage loop 54 in the example of FIG. 2. However, as opposed to the storage loop 54 in the example of FIG. 2, the readout Josephson junction $JJ_{RO}$ is not arranged as an escape Josephson junction to block the read data SFQ pulse $DT_R$, as described in the example of FIG. 6, but is instead arranged as a transmission Josephson junction. Therefore, the output signal OUT can be provided as one of an SFQ pulse or no SFQ pulse at the output 342 in response to triggering or no triggering of the readout Josephson junction $JJ_{RO}$, respectively, based on the amplitude of the loop current. Therefore, in the example of FIG. 7, the response to the read data SFQ pulse $DT_R$ in the first data state and the second data state, as provided at the output 342, is reversed relative to the storage loop 54 in the example of FIG. 2. Therefore, the superconducting gate memory circuit 320 is demonstrated as another example of storing a digital state relative to the superconducting gate memory circuit 50 in the example of FIG. 2.

Figure 8:
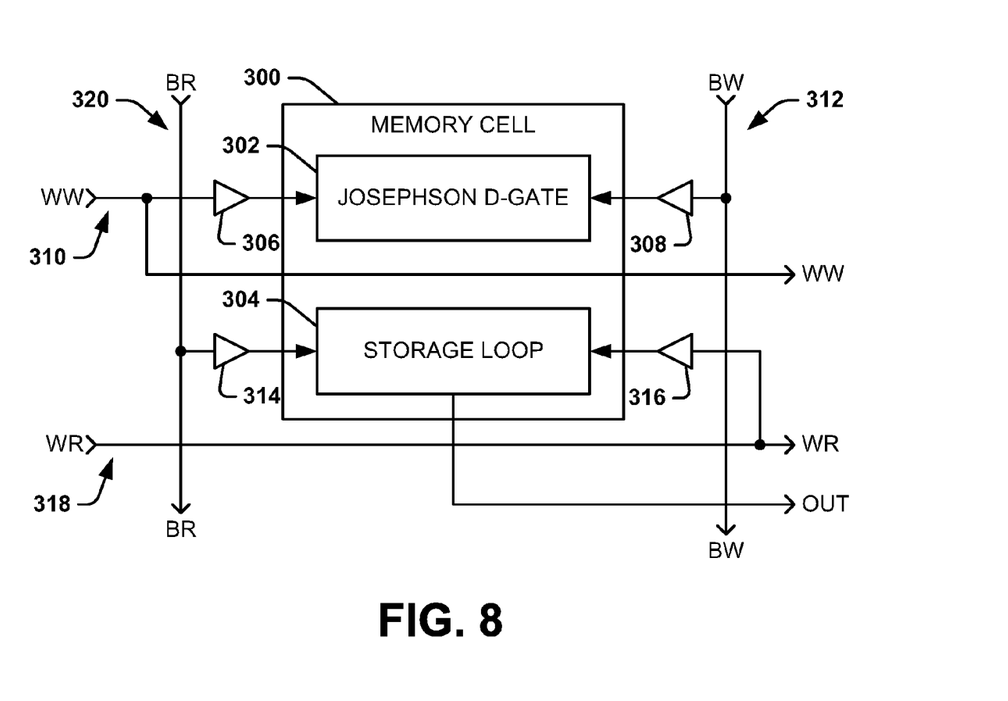
FIG. 8 illustrates an example diagram of a memory cell.

FIG. 8 illustrates an example diagram of a memory cell 300. The memory cell 300 can correspond to a single memory cell of a plurality of memory cells in a memory circuit, such as arranged in rows and columns. The memory cell 300 can thus correspond to a superconducting gate memory circuit, such as the superconducting gate memory circuit 10, the superconducting gate memory circuit 50, or the superconducting gate memory circuit 320 in the respective examples of FIGS. 1, 2, and 7. Thus, the memory cell 300 includes a Josephson D-gate circuit 302 which can be configured substantially similar to the Josephson D-gate circuit 52 in the example of FIG. 2. The memory cell 300 also includes a storage loop 304, such as the storage loop 54 in the example of FIG. 2 or the storage loop 324 in the example of FIG. 7, to provide an output signal OUT corresponding to the digital state stored in the respective Josephson D-gate circuit during a data read operation.

In the example of FIG. 8, the memory cell 300 also includes a first JTL 306 and a second JTL 308. The first JTL 306 can couple a word-write line 310 on which a word-write signal WW is provided to a write enable input of the Josephson D-gate circuit 302. The first JTL 306 can thus generate the write enable signal $EN_W$ from the word-write signal WW, such as an enable SFQ pulse (e.g., positive and negative enable SFQ pulses in an RQL manner). As another example, the first JTL 306 can be configured as a passive interconnect and the word-write signal WW can be a digital signal having a first binary state corresponding to the first binary state of the write enable signal $EN_W$, such that the first JTL 306 provides no SFQ pulse, and having a second binary state corresponding to the second binary state of the write enable signal $EN_W$, such that the first JTL 306 provides an enable SFQ pulse. As an example, the word-write line 310 can be coupled to each of a plurality of memory cells in a row of an array of memory cells that includes the memory cell 300. Thus, the first JTL 306 can generate an enable SFQ pulse from the word-write signal WW that is provided to enable a write operation of the row of memory cells, such as by splitting an SFQ pulse off from the word-write line 310.

The second JTL 308 can couple a bit-write line 312 on which a bit-write signal BW is provided to a write data input of the Josephson D-gate circuit 302. The second JTL 308 can thus generate the write data signal $DT_W$ from the bit-write signal BW, such as a data SFQ pulse (e.g., positive and negative enable SFQ pulses in an RQL manner). As another example, the second JTL 308 can be configured as a passive interconnect and the bit-write signal BW can be a digital signal having a first binary state corresponding to the first binary state of the write data signal $DT_W$, such that the second JTL 308 provides no SFQ pulse, and having a second binary state corresponding to the second binary state of the write data signal $DT_W$, such that the second JTL 308 provides an enable SFQ pulse. As an example, the bit-write line 312 can be coupled to each of a plurality of memory cells in a column of an array of memory cells that includes the memory cell 300. Thus, the second JTL 308 can generate a write data SFQ pulse from the bit-write signal BW that is provided to write a digital state to the row of memory cells, such as by splitting an SFQ pulse off from the bit-write line 312.

Similarly, in the example of FIG. 8, the memory cell 300 also includes a third JTL 314 and a fourth JTL 316. The third JTL 314 can couple a word-read line 318 on which a word-read signal WR is provided to a read enable input of the Josephson D-gate circuit 302. The third JTL 314 can thus generate the read enable signal $EN_R$ from the word-read signal WR, such as an enable SFQ pulse (e.g., positive and negative enable SFQ pulses in an RQL manner). As another example, the third JTL 314 can be configured as a passive interconnect and the word-read signal WR can be a digital signal having a first binary state corresponding to the first binary state of the read enable signal $EN_R$, such that the third JTL 314 provides no SFQ pulse, and having a second binary state corresponding to the second binary state of the read enable signal $EN_R$, such that the third JTL 314 provides an enable SFQ pulse. As an example, the word-read line 318 can be coupled to each of a plurality of memory cells in a row of an array of memory cells that includes the memory cell 300. Thus, the third JTL 314 can generate an enable SFQ pulse from the word-read signal WR that is provided to enable a read operation of the row of memory cells, such as by splitting an SFQ pulse off from the word-read line 318.

The fourth JTL 316 can couple a bit-read line 320 on which a bit-read signal BR is provided to a read data input of the Josephson D-gate circuit 302. The fourth JTL 316 can thus generate the read data signal $DT_R$ from the bit-read signal BR, such as a data SFQ pulse (e.g., positive and negative enable SFQ pulses in an RQL manner). As another example, the fourth JTL 316 can be configured as a passive interconnect and the bit-read signal BR can be a digital signal having a first binary state corresponding to the first binary state of the read data signal $DT_R$, such that the fourth JTL 316 provides no SFQ pulse, and having a second binary state corresponding to the second binary state of the read data signal $DT_R$, such that the fourth JTL 316 provides an enable SFQ pulse. As an example, the bit-read line 320 can be coupled to each of a plurality of memory cells in a column of an array of memory cells that includes the memory cell 300. Thus, the fourth JTL 316 can generate a read data SFQ pulse from the bit-read signal BR that is provided to read a digital state from the row of memory cells, such as by splitting an SFQ pulse off from the bit-read line 320.

Figure 9:
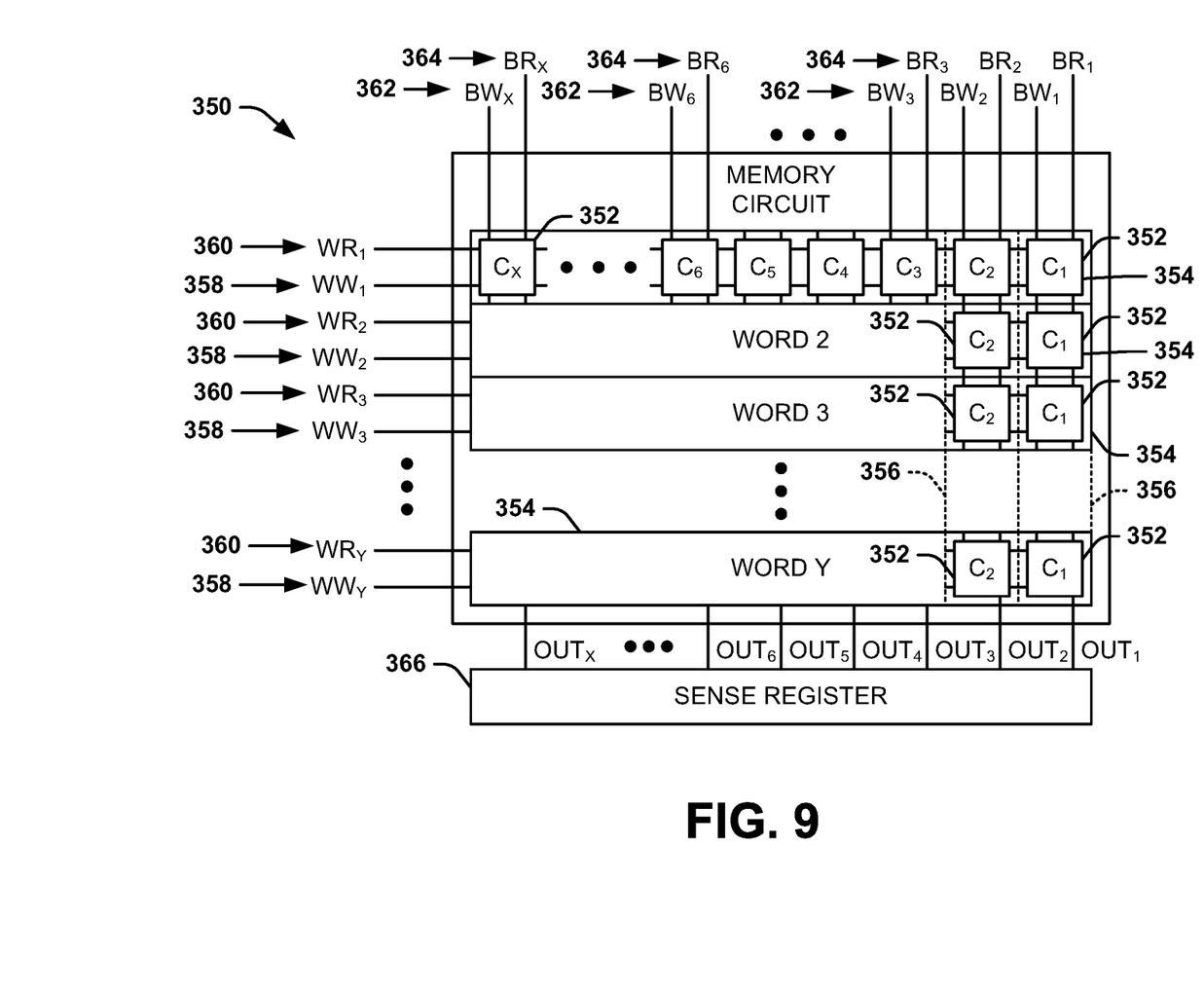
FIG. 9 illustrates an example of a memory circuit

FIG. 9 illustrates an example of a memory circuit 350. The memory circuit 350 can be implemented as a memory structure in a variety of quantum and/or classical computing applications. As an example, the memory circuit 350 can be configured cryogenically in a quantum computing circuit, such as operating at approximately 4 Kelvin or less, to store classical data and/or controller instructions in a quantum computing environment.

The memory circuit 350 is demonstrated in the example of FIG. 9 as being arranged as an array of memory cells 352. Specifically, the memory cells 352 are arranged in rows 354 that each correspond to a data word, demonstrated as WORD 1 through WORD Y, where Y is an integer greater than 1. Each of the rows 354 includes a set of memory cells 352 that form X columns 356 across the rows 354, with the memory cells 352 in WORD 1 being demonstrated in the example of FIG. 9 as $C_1$ to $C_X$, where X is an integer greater than 1. Therefore, each of the memory cells 352 in the array of the memory circuit 350 can be individually addressable by row 354 and column 356.

In the example of FIG. 9, each of the rows 354 is demonstrated as having an associated word-write line 358 and word-read line 360, demonstrated as providing word-write and word-read signals $WW_1$ and $WR_1$ through $WW_Y$ and $WR_Y$, respectively. The word-write lines 358 and word-read lines 360 can be coupled to each of the memory cells 352 in each of the rows 354 of the memory circuit 350, such as via interconnects (e.g., a first JTL 306 in each of the memory cells 352). In addition, each of the memory cells 352 is demonstrated as having an associated bit-write line 362, demonstrated as providing bit-write signals $BW_1$ through $BW_X$. The bit-write lines 362 can be coupled to each corresponding numbered memory cell 352 in each of the columns 356 of the memory circuit 350, such as via interconnects (e.g., a second JTL 308 in each of the memory cells 352).

Each of the memory cells 352 is configured to store a single bit of data as a respective digital state. Specifically, each of the memory cells 352 can be configured substantially similar to the memory cell 300 in the example of FIG. 8. Specifically, each of the memory cells 352 can include a superconducting gate memory circuit that includes a Josephson D-gate 302 and a storage loop 304, such as similar to the Josephson D-gate 52 and the storage loop 54 in the example of FIG. 2. The digital state of each of the memory cells 352 can be set in response to a respective word-write signal WW that is provided on the respective word-write line 358 to provide respective write enable signals $EN_W$ (e.g., write enable SFQ pulses) to activate each of the memory cells 352 in the row for a data write operation, and a bit-write signal BW that is provided on the respective bit-write line 362 to provide respective write data signals $DT_W$ (e.g., write data SFQ pulses) to write the digital state to the respective activated memory cells 352. As an example, the word-write signals WW and the bit-write signals BW can be provided as respective SFQ pulses that propagate along the respective word-write lines 358 and bit-write lines 362.

Similarly, the respective digital state that is stored in each of the memory cells 352 can be read from the memory cells 352 based on a word-read signal WR that is provided on the respective word-read line 360 to select a given one of the rows 354 for a data read operation. The digital state of each of the memory cells 352 can be read in response to a respective word-read signal WR that is provided on the respective word-read line 360 to provide respective read enable signals $EN_R$ (e.g., read enable SFQ pulses) to activate each of the memory cells 352 in the row for a data read operation (e.g., to bias the respective readout Josephson junction in the storage loop of each of the memory cells 352), and a bit-read signal BR that is provided on the respective bit-read line 364 to provide respective read data signals $DT_R$ (e.g., read data SFQ pulses) to read the digital state of the respective activated memory cells 352. As an example, the word-read signals WR and the bit-read signals BR can be provided as respective SFQ pulses that propagate along the respective word-read lines 360 and bit-read lines 364. As an example, the output of each of the memory cells 352 can be coupled to a sense register 366 that is configured to determine whether the digital state of each of the memory cells 352 of an associated row 354 corresponds to a logic-one state or a logic-zero state Accordingly, the sense register 366 can read out the digital states of the memory cells 352 as respective output signals $OUT_1$ through $OUT_X$ via respective storage loops (e.g., the storage loop 14 in the example of FIG. 1).

Figure 10:
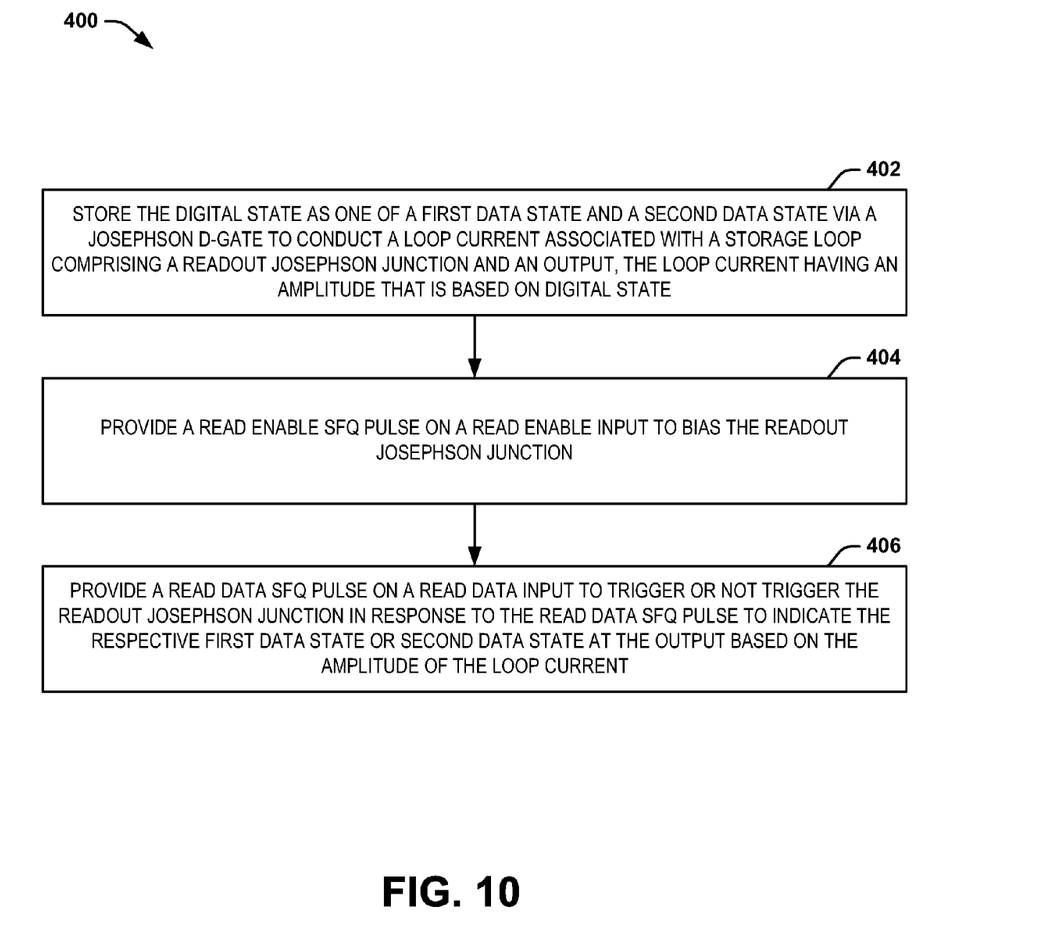
FIG. 10 illustrates an example of a method for reading a digital state from a superconducting gate memory circuit.

In view of the foregoing structural and functional features described above, a methodology in accordance with various aspects of the present invention will be better appreciated with reference to FIG. 10. While, for purposes of simplicity of explanation, the methodology of FIG. 10 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 10 illustrates an example of a method 400 for reading a digital state (e.g., the digital state OUT) from a superconducting gate memory circuit (e.g., the superconducting gate memory circuit 10). At 402, the digital state is stored as one of a first data state and a second data state via a Josephson D-gate (e.g., the Josephson D-gate 12) to conduct a loop current (e.g., the loop current $I_{Loop}$) associated with a storage loop (e.g., the storage loop 14) comprising a readout Josephson junction (e.g., the readout Josephson junction $JJ_{RO}$) and an output (e.g., the output 72). The loop current can have an amplitude that is based on the digital state. At 404, a read enable SFQ pulse (e.g., the read enable SFQ pulse $EN_R$) on a read enable input (e.g., the read enable input 70) to bias the readout Josephson junction. At 406, a read data SFQ pulse (e.g., the read data SFQ pulse $DT_R$) is provided on a read data input (e.g., the read data input 68) to trigger or not trigger the readout Josephson junction in response to the read data SFQ pulse to indicate the respective first data state or second data state at the output based on the amplitude of the loop current.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A superconducting gate memory circuit comprising:
   a gate circuit configured to set a digital state as one of a first data state and a second data state in response to a presence of or absence of a write data Single Flux Quantum (SFQ) pulse provided on a data write input; and a storage loop coupled to the gate circuit and configured to conduct a loop current having a current amplitude that is set based on the digital state.

2. The circuit of claim 1, wherein the gate circuit is configured as a Josephson D-gate circuit configured to set the digital state as one of the first data state and the second data state in response to a write enable SFQ pulse provided on a write enable input and the respective presence of or absence of the write data SFQ pulse provided on the data write input.

3. The circuit of claim 1, wherein the storage loop is configured to provide a readout of the digital state at an output in response to a read enable SFQ pulse provided on a read enable input and a read data SFQ pulse provided on a read data input.

4. The circuit of claim 3, wherein the storage loop is configured to conduct a loop current having an amplitude that is set by the gate circuit, the storage loop comprising a readout Josephson junction that is configured to trigger or not trigger in response to the read enable SFQ pulse and the read data SFQ pulse to indicate the respective first data state or second data state at the output based on an amplitude of the loop current.

5. The circuit of claim 4, wherein the gate comprises a first Josephson junction associated with the write enable input and a second Josephson junction associated with the write data input, wherein the digital state corresponds to a superconducting phase associated with the first Josephson junction.

6. The circuit of claim 1, wherein the storage loop comprises at least one loop transformer, each of the at least one loop transformer comprises:
 a primary inductor configured to conduct a bias current;
 a secondary inductor in series with a readout Josephson junction and being configured to induce the loop current, such that the loop current has a first current amplitude that is set by the gate circuit corresponding to the first data state, and a second amplitude that is set by the gate circuit corresponding to the second data state.

7. The circuit of claim 6, wherein one of the at least one loop transformer further comprises a tertiary inductor that is inductively coupled to the primary inductor associated with the respective at least one loop transformer, the tertiary inductor being configured to conduct a read enable SFQ pulse to change the amplitude of the loop current to bias the readout Josephson junction to facilitate a readout of the digital state.

8. The circuit of claim 6, wherein the storage loop is configured to receive a read data SFQ pulse to trigger the readout Josephson junction in response to the loop current having the second amplitude, or to not trigger the readout Josephson junction in response to the loop current having the first amplitude.

9. The circuit of claim 6, wherein the second amplitude of the loop current is approximately equal to the first amplitude of the loop current minus an induced current component corresponding to a superconducting phase of at least one Josephson junction associated with the gate circuit that that is induced in the storage loop.

10. A memory cell comprising the superconducting gate memory circuit of claim 1, the memory cell further comprising:

a first Josephson transmission line (JTL) interconnect that couples a word-write line to a write enable input to provide a write enable SFQ pulse based on a word-write signal that propagates on the word-write line;
a second JTL interconnect that couples a bit-write line to a write data input to provide a write data SFQ pulse based on a bit-write signal that propagates on the bit-write line;
a third JTL interconnect that couples a word-read line to a read enable input to provide a read enable SFQ pulse based on a word-read signal that propagates on the word-read line; and
a fourth JTL interconnect that couples a bit-read line to a read data input to provide a read data SFQ pulse based on a bit-read signal that propagates on the bit-read line.

11. A superconducting memory circuit comprising a plurality of memory cells of claim 10 arranged in an array of a plurality of rows and a plurality of columns, wherein the word-write line is one of a respective plurality of word-write lines configured to select a respective one of plurality of rows and wherein the bit-write line is one of a respective plurality of bit-write lines configured to write data into a set of the plurality of memory cells corresponding to the selected one of the plurality of rows during a data write operation, and wherein the word-read line is one of a respective plurality of word-read lines configured to select a respective one of plurality of rows and wherein the bit-read line is one of a respective plurality of bit-read lines configured to read data from a set of the plurality of memory cells corresponding to the selected one of the plurality of rows during a data read operation.

12. A method for reading a digital state from a superconducting memory circuit, the method comprising:
 storing the digital state as one of a first data state and a second data state based on an amplitude of a loop current flowing in a storage loop; and
 providing a read data single flux quantum (SFQ) pulse on a read data input to trigger or not trigger a readout Josephson junction in response to the read data SFQ pulse to indicate the respective first data state or second data state at an output based on the amplitude of the loop current.

13. The method of claim 12, further comprising providing a read enable SFQ pulse on a read enable input to bias the readout Josephson junction, wherein providing the read data SFQ pulse comprises providing the read data SFQ pulse on the read data input to trigger or not trigger the biased readout Josephson junction.

14. The method of claim 12, further comprising providing a bias current to at least one loop transformer, each of the at least one loop transformer comprising a primary inductor configured to conduct the bias current and a secondary inductor in series with the readout Josephson junction and being configured to induce the loop current, such that the loop current has a first amplitude corresponding to the first data state, and a second amplitude corresponding to the second data state.

15. The method of claim 14, wherein one of the at least one loop transformer further comprises a tertiary inductor that is inductively coupled to the primary inductor associated with the respective at least one loop transformer, the method further comprising providing a read enable SFQ pulse to the tertiary inductor to change the amplitude of the loop current to bias the readout Josephson junction.

16. The method of claim 12, wherein storing the digital state comprises storing the digital state as one of the first data state and the second data state via a Josephson D-gate to conduct the loop current associated with a storage loop.

17. The method of claim 12, wherein the loop current has a first amplitude corresponding to the first data state, and a second amplitude corresponding to the second data state, wherein the second amplitude of the loop current is approximately equal to the first amplitude of the loop current minus an induced current component corresponding to a superconducting phase of at least one Josephson junction associated with the Josephson D-gate that that is induced in the storage loop.

18. A memory cell circuit comprising:
   a first Josephson transmission line (JTL) interconnect that couples a word-write line to a write enable input to provide a write enable single flux quantum (SFQ) pulse based on a word-write signal that propagates on the word-write line;
   a second JTL interconnect that couples a bit-write line to a write data input to provide a write data SFQ pulse based on a bit-write signal that propagates on the bit-write line;
   a third JTL interconnect that couples a word-read line to a read enable input to provide a read enable SFQ pulse based on a word-read signal;
   a fourth JTL interconnect that couples a bit-read line to a read data input to provide a read data SFQ pulse based on a bit-read signal; and
   a storage loop configured to store the digital state as one of a first data state and a second data state in response to the write enable SFQ pulse and a respective presence of or absence of the write data SFQ pulse, and to readout the digital state at an output in response to the read enable SFQ pulse and the read data SFQ pulse.

19. The circuit of claim 18, further comprising a Josephson D-gate circuit coupled to the storage loop and being configured to set the digital state as one of the first data state and the second data state in response to the write enable SFQ pulse and the respective presence of or absence of the write data SFQ pulse, wherein the storage loop is configured to conduct a loop current having an amplitude that is set by the Josephson D-gate circuit, the storage loop comprising a readout Josephson junction that is configured to trigger or not trigger in response to the read enable SFQ pulse and the read data SFQ pulse to indicate the respective first data state or second data state at the output based on an amplitude of the loop current.

20. The circuit of claim 19, wherein the storage loop comprises at least one loop transformer, each of the at least one loop transformer comprises:
   a primary inductor configured to conduct a bias current;
   a secondary inductor in series with the readout Josephson junction and being configured to induce the loop current, such that the loop current has a first amplitude corresponding to the first data state, and a second amplitude that is set by the Josephson D-gate corresponding to the second data state.

* * * * *